United States Patent
Le Grand de Mercey

(10) Patent No.: US 8,913,978 B2
(45) Date of Patent: Dec. 16, 2014

(54) RTWO-BASED DOWN CONVERTER

(75) Inventor: Gregoire Le Grand de Mercey, Menlo Park, CA (US)

(73) Assignee: Analog Devices, Inc., Norwood, MA (US)

( * ) Notice: Subject to any disclaimer, the term of this patent is extended or adjusted under 35 U.S.C. 154(b) by 1198 days.

(21) Appl. No.: 12/100,391

(22) Filed: Apr. 9, 2008

(65) Prior Publication Data

US 2009/0045850 A1  Feb. 19, 2009

Related U.S. Application Data

(60) Provisional application No. 60/910,809, filed on Apr. 9, 2007.

(51) Int. Cl.
*H04B 1/26* (2006.01)
*H03B 27/00* (2006.01)
*H03D 7/16* (2006.01)

(52) U.S. Cl.
CPC .............. *H03D 7/165* (2013.01); *H03B 27/00* (2013.01)
USPC ........... 455/323; 455/326; 455/333; 455/293; 341/166; 327/39; 327/40

(58) Field of Classification Search
USPC ......... 455/326, 323, 333, 293, 324, 313, 342, 455/168.1, 318; 341/166; 327/39, 40
See application file for complete search history.

(56) References Cited

U.S. PATENT DOCUMENTS

| | | |
|---|---|---|
| 5,302,920 A | 4/1994 | Bitting |
| 5,448,772 A | 9/1995 | Grandfield |
| 5,584,067 A | 12/1996 | V. Buer et al. |
| 5,592,126 A | 1/1997 | Boudewijns et al. |
| 5,652,549 A | 7/1997 | Unterricker et al. |
| 5,825,211 A | 10/1998 | Smith et al. |
| 6,002,274 A | 12/1999 | Smith et al. |
| 6,150,886 A | 11/2000 | Shimomura |
| 6,157,037 A | 12/2000 | Danielson |
| 6,194,947 B1 | 2/2001 | Lee et al. |
| 6,259,747 B1 | 7/2001 | Gustafsson et al. |
| 6,281,759 B1 | 8/2001 | Coffey |
| 6,323,737 B1 | 11/2001 | Broekaert |
| 6,396,359 B1 | 5/2002 | Hajimiri et al. |
| 6,426,662 B1 | 7/2002 | Arcus |
| 6,566,968 B2 | 5/2003 | Afghahi |
| 6,781,424 B2 | 8/2004 | Lee et al. |
| 6,856,208 B2 | 2/2005 | Lee et al. |

(Continued)

FOREIGN PATENT DOCUMENTS

WO  WO 01/89088 A1  11/2001

*Primary Examiner* — Junpeng Chen
(74) *Attorney, Agent, or Firm* — Knobbe, Martens, Olson & Bear, LLP

(57) ABSTRACT

A multiphase mixer using a rotary traveling wave oscillator is disclosed. In addition to the oscillator, the mixer includes first and second mixer circuits. The rotary traveling wave oscillator generates a first set of N/2 phase and a second set of N/2 phases, where each phase has a frequency that is a factor of N/2 less than the incoming radio frequency signal. The first set of phases are sine signals and the second set of phases are cosine signals. The first mixer circuit generates a first down-converted signal from the first set of phases and the incoming rf signal. The second mixer circuit generates a second down-converted signal from the second set of phases and the rf signal.

19 Claims, 4 Drawing Sheets

(56) References Cited

U.S. PATENT DOCUMENTS

| | | | |
|---|---|---|---|
| 6,870,431 B2 | 3/2005 | Afghahi | |
| 6,900,699 B1 | 5/2005 | Kim | |
| 6,943,599 B2 | 9/2005 | Ngo | |
| 6,995,620 B2 | 2/2006 | Afghahi | |
| 6,999,747 B2 * | 2/2006 | Su | 455/324 |
| 7,005,930 B1 | 2/2006 | Kim et al. | |
| 7,085,668 B2 | 8/2006 | Johnson | |
| 7,088,154 B2 | 8/2006 | Ngo | |
| 7,091,802 B2 | 8/2006 | Ham et al. | |
| 7,130,604 B1 | 10/2006 | Wong et al. | |
| 7,218,180 B2 | 5/2007 | Wood | |
| 7,224,199 B1 | 5/2007 | Kang | |
| 7,224,235 B2 | 5/2007 | De Ranter et al. | |
| 7,242,272 B2 | 7/2007 | Ham et al. | |
| 7,274,262 B2 | 9/2007 | Ham et al. | |
| 7,295,076 B2 | 11/2007 | Kim et al. | |
| 7,307,483 B2 * | 12/2007 | Tzartzanis et al. | 331/57 |
| 7,315,219 B2 | 1/2008 | Chiang | |
| 7,339,439 B2 | 3/2008 | Roubadia et al. | |
| 7,378,893 B1 | 5/2008 | Kang | |
| 7,397,230 B2 | 7/2008 | Tabaian et al. | |
| 7,409,012 B2 | 8/2008 | Martin et al. | |
| 7,446,578 B2 | 11/2008 | Huang | |
| 7,471,153 B2 | 12/2008 | Kee et al. | |
| 7,482,884 B2 | 1/2009 | Wang et al. | |
| 7,504,895 B2 | 3/2009 | Neidorff | |
| 7,511,588 B2 | 3/2009 | Gabara | |
| 7,513,873 B2 | 4/2009 | Shifrin | |
| 7,515,005 B2 | 4/2009 | Dan | |
| 7,541,794 B2 | 6/2009 | Tabaian et al. | |
| 7,545,225 B2 | 6/2009 | Beccue | |
| 7,551,038 B2 | 6/2009 | Jang et al. | |
| 7,571,337 B1 | 8/2009 | Zhai et al. | |
| 7,577,225 B2 | 8/2009 | Azadet et al. | |
| 7,609,756 B2 | 10/2009 | Wood | |
| 7,612,621 B2 | 11/2009 | Kim et al. | |
| 7,616,070 B2 | 11/2009 | Tzartzanis et al. | |
| 7,630,700 B2 * | 12/2009 | Vaisanen | 455/313 |
| 7,656,239 B2 | 2/2010 | Bietti et al. | |
| 7,656,336 B2 | 2/2010 | Wood | |
| 7,656,979 B2 | 2/2010 | Leydier et al. | |
| 7,663,328 B2 | 2/2010 | Gonder | |
| 7,715,143 B2 | 5/2010 | Bliss et al. | |
| 7,741,921 B2 | 6/2010 | Ismailov | |
| 7,782,988 B2 | 8/2010 | Ziesler | |
| 7,833,158 B2 | 11/2010 | Bartz | |
| 7,847,643 B2 | 12/2010 | Da Dalt | |
| 7,885,625 B2 | 2/2011 | Muhammad et al. | |
| 7,893,778 B2 | 2/2011 | Mohtashemi et al. | |
| 7,907,023 B2 | 3/2011 | Liang et al. | |
| 7,911,284 B2 | 3/2011 | Kuwano | |
| 7,924,076 B2 | 4/2011 | Suzuki et al. | |
| 7,936,193 B2 | 5/2011 | Van Der Wel et al. | |
| 7,944,316 B2 | 5/2011 | Watanabe et al. | |
| 7,952,439 B1 | 5/2011 | Heggemeier et al. | |
| 7,973,609 B2 | 7/2011 | Ohara et al. | |
| 7,995,364 B2 | 8/2011 | Shiu | |
| 8,008,981 B2 | 8/2011 | Hong et al. | |
| 8,049,563 B2 | 11/2011 | Aoki et al. | |
| 8,169,267 B2 | 5/2012 | Le Grand De Mercey | |
| 8,410,858 B2 | 4/2013 | Wood | |
| 2003/0094976 A1 * | 5/2003 | Miyashita | 327/40 |
| 2004/0002315 A1 * | 1/2004 | Lin | 455/255 |
| 2004/0196939 A1 * | 10/2004 | Co | 375/376 |
| 2005/0070242 A1 * | 3/2005 | Davis | 455/293 |
| 2005/0225365 A1 | 10/2005 | Wood | |
| 2006/0003717 A1 * | 1/2006 | Sowlati | 455/168.1 |
| 2006/0208776 A1 | 9/2006 | Tonietto et al. | |
| 2007/0112904 A1 * | 5/2007 | Kasperkovitz | 708/620 |
| 2008/0009259 A1 * | 1/2008 | Chang et al. | 455/318 |
| 2008/0074202 A1 | 3/2008 | Gabara | |
| 2008/0272952 A1 * | 11/2008 | Wood | 341/166 |
| 2009/0322394 A1 | 12/2009 | Song et al. | |
| 2010/0117744 A1 | 5/2010 | Takinami et al. | |
| 2010/0156549 A1 | 6/2010 | Uemura et al. | |
| 2010/0321121 A1 | 12/2010 | Mohtashemi | |
| 2011/0095833 A1 | 4/2011 | Mohtashemi et al. | |
| 2011/0156760 A1 | 6/2011 | Bhuiyan et al. | |
| 2011/0156773 A1 | 6/2011 | Beccue | |
| 2011/0195683 A1 | 8/2011 | Brekelmans et al. | |
| 2011/0286510 A1 | 11/2011 | Levantino et al. | |
| 2012/0008717 A1 | 1/2012 | van Sinderen et al. | |
| 2012/0013363 A1 | 1/2012 | Takinami et al. | |
| 2012/0013407 A1 | 1/2012 | Takinami et al. | |
| 2012/0025918 A1 | 2/2012 | Wang et al. | |

* cited by examiner

RTWO-BASED DOWN CONVERTER

CROSS REFERENCE TO RELATED APPLICATION

This application claims priority to U.S. Provisional Application Ser. No. 60/910,809, filed Apr. 9, 2007, and titled "RTWO-BASED DOWN CONVERTER", which provisional application is incorporated by reference into the present application.

FIELD OF INVENTION

This invention relates generally to mixers in radio frequency applications and more particularly to mixers using multiphase reduced frequency conversion techniques.

BACKGROUND

A rotary traveling wave oscillator is described in U.S. Pat. No. 6,556,089, which is incorporated by reference into the present application. In that patent, a wave front moves around a closed, differential loop, reversing its polarity in each transit of the loop. The wave front traveling on the loop is established and maintained by a plurality of regeneration elements, such as back to back inverters, distributed about the entire loop. At any point on the differential loop, a differential clock signal is available by making a connection to that point. The frequency of the clock signal is determined by the electrical size of the loop, by which is meant the time it takes to make a lapse around the loop, given the loop's loaded transmission line characteristics.

The rotary clock technology makes it possible to obtain a large number of clock phases from a single physical circuit, creating new architecture possibilities.

For those architectures that need several phases (more than 2) simultaneously, a common solution is a ring oscillator. In that case, the phases order is defined by the circuit order itself. However, ring oscillators have a limited number of phases available, determined mostly by the time delay of the inverter used. Also, the spectral purity and the current/power consumption are known to be critical limitations for the ring oscillator. For applications that need good spectral purity and low power consumption, generation of multiple phases is also possible by injecting multiple oscillators together in such a way that they are operating at the same frequency, but with a well-known phase delay between them. The I/Q (90 degree out of phase) signal generation is a common requirement for wireless systems with modern digital modulation. This solution is practical if a low number of phases is needed.

The rotary clock is ideal for multiple phase generation, the time delay between two phases being mostly defined by the transmission line and the capacitive loading. This time can be significantly lower than the minimum time delay of an inverter for the technology used and the spectral purity of the phases is comparable or better than the standard LC tank solution.

BRIEF DESCRIPTION OF THE DRAWINGS

These and other features, aspects and advantages of the present invention will become better understood with regard to the following description, appended claims, and accompanying drawings where:

SUMMARY OF INVENTION

Figure 1A:
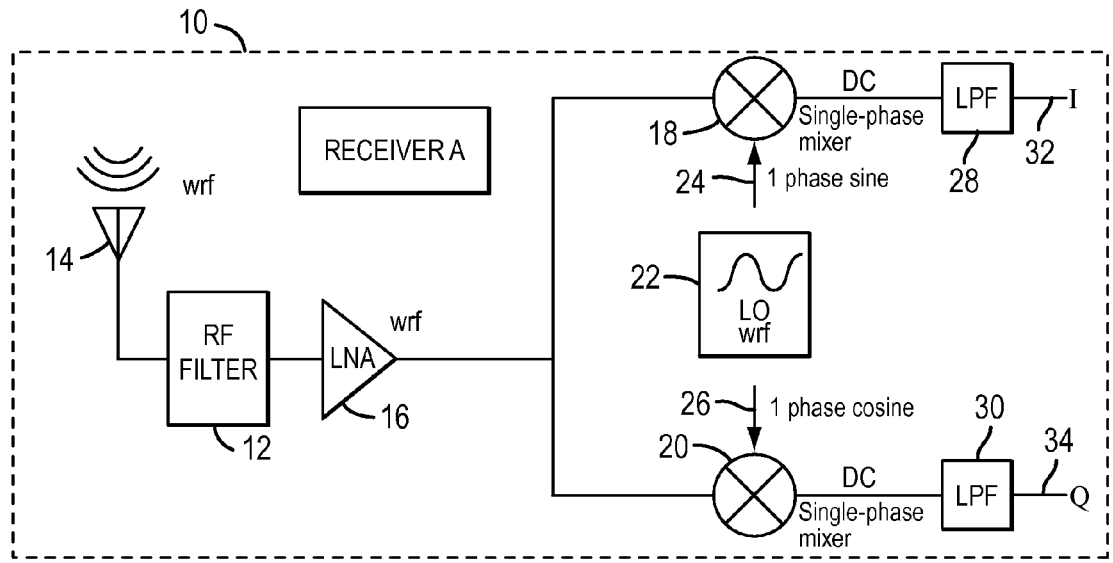
FIG. 1A shows a prior art conversion, receiver A.

One embodiment of the present invention is a multiphase mixer that includes a rotary traveling wave oscillator, a first mixer circuit, and a second mixer circuit. The rotary traveling wave oscillator generates a first plurality N/2 phases and a second plurality of N/2 phases. Each phase has a frequency that is less than the incoming radio frequency signal by a factor of N/2. Each of the first plurality of phases is 90° out of phase with each of the second plurality of phases respectively. The first mixer circuit receives the incoming radio frequency signal and the first plurality of phases from the rotary traveling wave oscillator and generates an output which is the first down converted signal. The second mixer circuit receives the incoming radio frequency signal and the second plurality of phases and generates a second down converted signal.

In one embodiment, the first and second mixer circuits include a first and second pairs of CMOS transistors where in each pair the transistors have their channels in series between first and second voltage sources. The first pair has its first and second gates connected, respectively, to first and second phases from the rotary oscillator and the second pair has its first and second gates connected, respectively, to said second and first phases. The output of each mixer circuit is present at the drains of each pair of transistors.

DETAILED DESCRIPTION OF THE INVENTION

The rotary clock is applicable to the 60 GHz wireless HD standard, which is technically a very challenging standard for today's CMOS technologies. A key concept is that, instead of operating the clock at 60 GHz, the clock operates at a lower frequency but has multiple phases so that access to the time resolution represented by a 60 GHz clock is still possible, but with low cost standard technology. Using a lower frequency offers many advantages in term of power, dc offset (LO leakage), reciprocal mixing.

The present invention is directed towards circuitry that can achieve direct-conversion (homodyne architecture) of a high frequency signal (at $w_{rf}$) with a local oscillator (LO), delivering multiple phases (N phases) oscillating at a lower frequency ($2 \cdot w_{rf}/N$) in conjunction with a multi-phase mixer.

The concept behind that circuit is that mixing a single phase high frequency periodic signal is mathematically equivalent to mixing a set of multiphase reduced frequency periodic signals.

Mathematically, the sine and the cosine with a frequency $w_{rf}$ are equivalent to the weighted product of $N/2-1$ sine waves at a frequency $w_{rf}/(N/2)$.

$$\cos(w_{rf} \cdot t) = 2^{N/2-1} \prod_{k=0}^{N/2-1} \sin\left(\frac{2 \cdot w_{rf}}{N}t - \frac{2 \cdot k \cdot \pi}{N} + \frac{\pi}{N}\right)$$

$$\sin(w_{rf} \cdot t) = 2^{N/2-1} \prod_{k=0}^{N/2-1} \sin\left(\frac{2 \cdot w_{rf}}{N}t - \frac{2 \cdot k \cdot \pi}{N}\right)$$

Using a lower frequency for the LO offers at least two advantages: (i) there is low LO leakage (less DC offset), and (ii) the oscillation frequency for the local oscillator is lower.

Figure 1B:
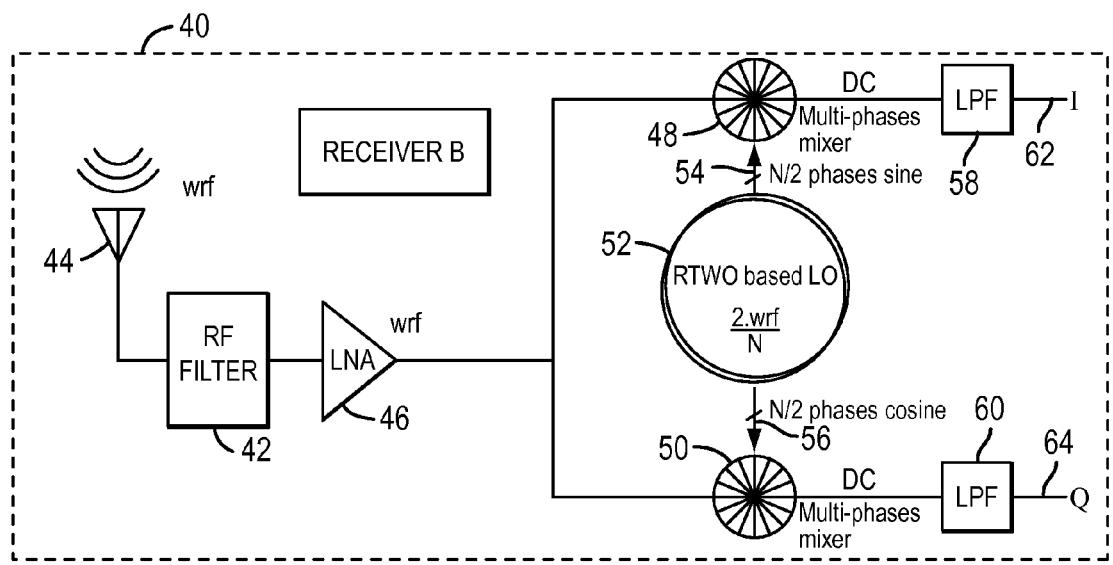
FIG. 1B shows a representative architecture of the present invention, receiver B.

The proposed architecture is presented in FIG. 1B. The receiver A 10 in FIG. 1A is the standard implementation whereas the receiver B 40 takes advantage of the availability of the multiple phases of the rotary clock. Receiver A 10 includes an RF filter 12 connected to the receiving antenna 14, an LNA 16 which amplifies the output of the RF filter 12 and a pair of single-phase mixers 18, 20. One of the mixers, the sine mixer 18, mixes the output of the LNA 16 with a local oscillator 22 single phase sine signal 24. The other mixer, the cosine mixer 20, mixes the output of the LNA 16 with a local oscillator 22 single phase cosine signal 26. Each output of the sine and cosine mixers 18, 20 is applied to a low pass filter 28, 30, one LPF 28 output generating the I signal 32 and the other LPF 30 output generating the Q signal 34.

Receiver B 40 in FIG. 1B includes an RF filter 42 connected to the receiving antenna 44, an LNA 46 which amplifies the output of the RF filter 42, and a pair of multi-phase mixers 48, 50. One of the multiphase mixers 48 operates with N/2 sine phases 54 and the other multiphase mixer 50 operates with N/2 cosine phases 56. The output of sine mixer 48 is applied to an LPF 58 to generate the I signal 62 and the output of the cosine mixer 50 is applied to an LPF 60 to generate the Q signal 64. The Local Oscillator 52 in Receiver B 40 is a Rotary Traveling Wave Oscillator operating at a frequency $w_{rf}/(N/2)$ whereas the local oscillator 22 in Receiver A 10 operates at a frequency $w_{rf}$. Thus, the Rotary Traveling Wave Oscillator 52 operates at a frequency that is a factor $(N/2)^{-1}$ of the frequency of the local oscillator 22 in Receiver A.

Figure 3:
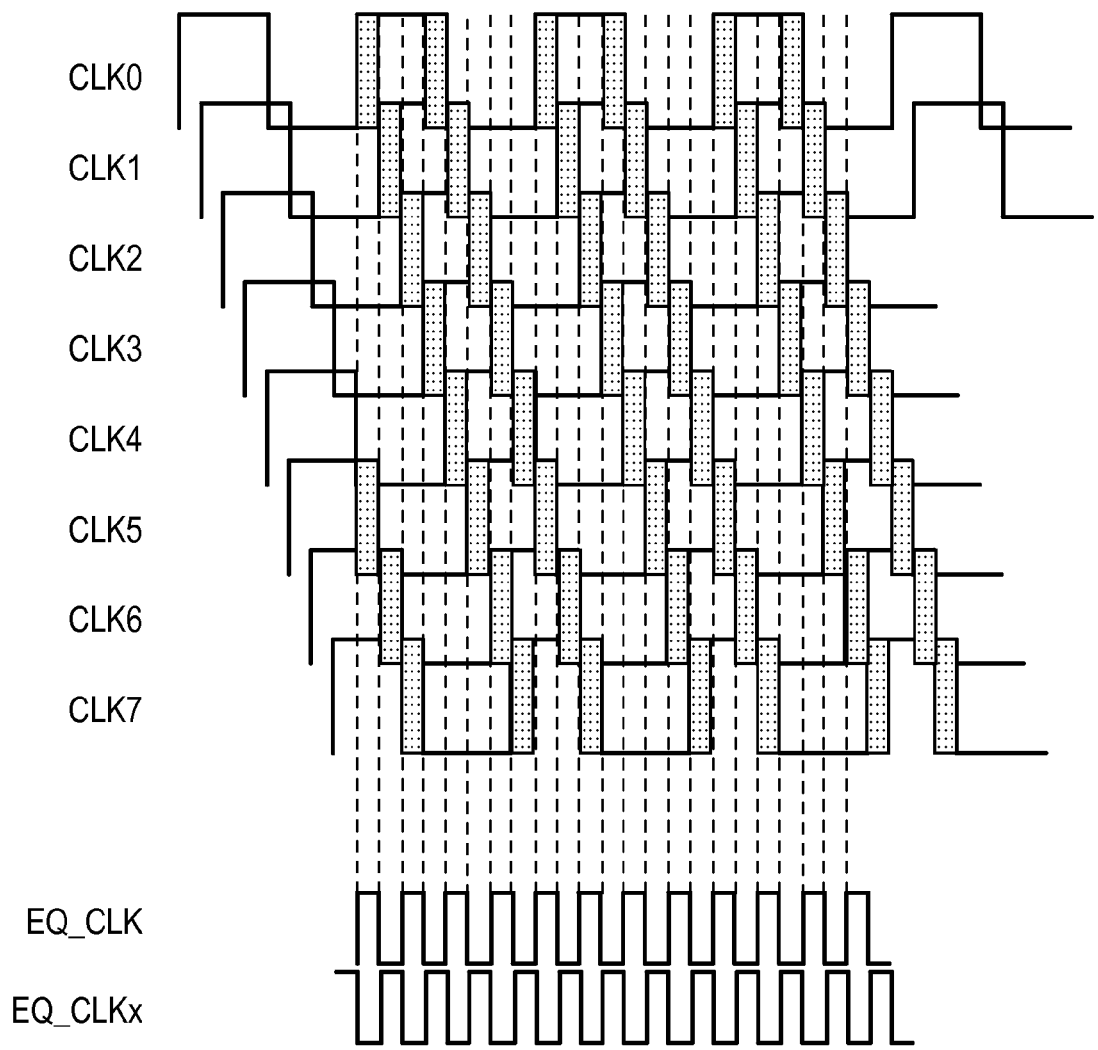
FIG. 3 shows a representative timing diagram with 8 phases.

FIG. 3 shows a representative timing diagram for the case of 8 phases. Also shown are the equivalent clocks represented by the availability of the multiple phases. Using an overlap between a particular phase and one that is 5 phases away, produces eight unique overlapping times (shown as shaded portions).

Figure 4A:
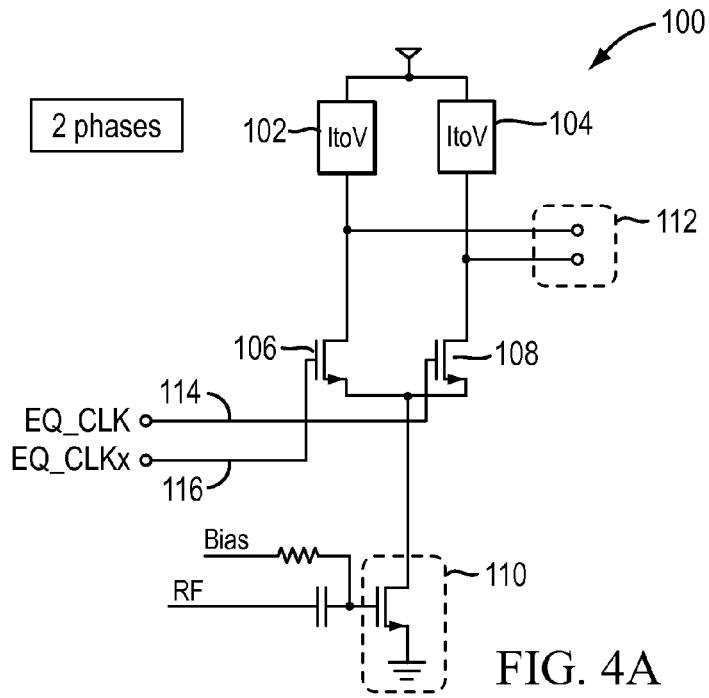
FIG. 4A shows an implementation of a mixer circuit with 2 phases and with eight phases.
Figure 4B:
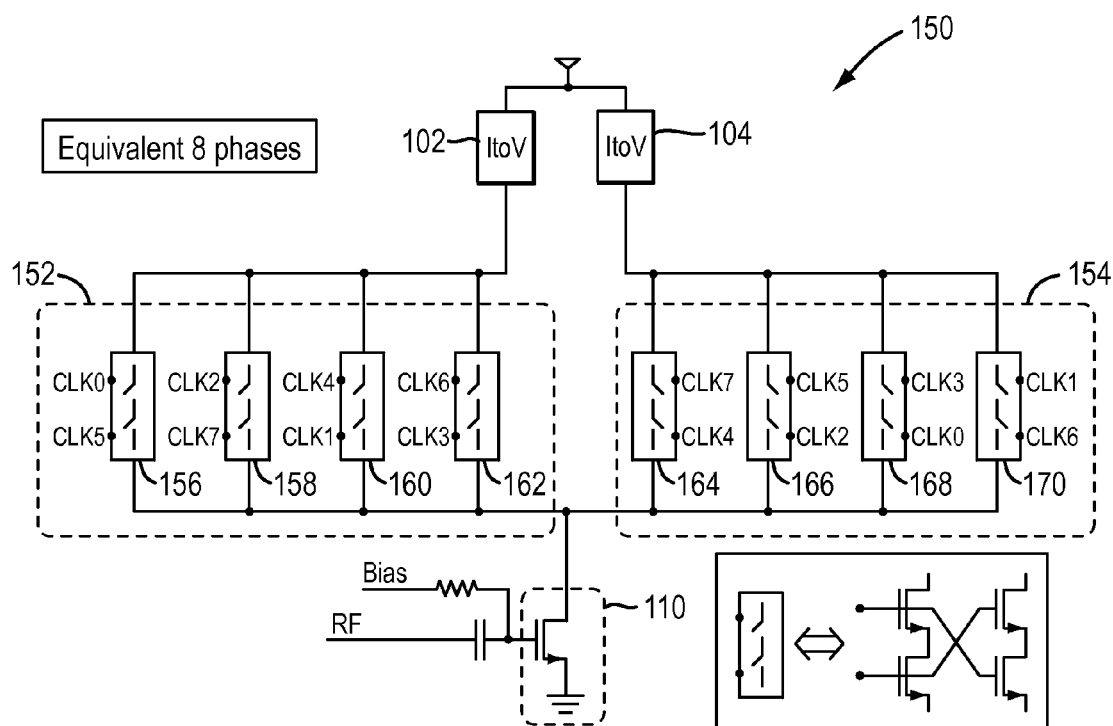

FIG. 4A shows an implementation of a mixer circuit 100 with two phases and FIG. 4B shows a mixer circuit 150 with eight phases. The two-phase mixer circuit 100 in FIG. 4A includes a pair of I-to-V blocks 102, 104, each providing a current-to-voltage conversion. Implementations of the I-to-V block include a resistor, transistor, or the input of an operational amplifier properly configured. The two-phase mixer 100 also includes a pair of transistors 106, 108 and a current source 110, forming a differential pair, which develops a differential output 112 using the I-to-V blocks 106, 108. In one embodiment, the current source 110 is a biased transistor, as shown. The two phases, EQ_CLK 114 and EQ_CLKx 116, to be mixed are provided to the gates of the differential pair transistors 106, 108.

The 8-phase mixer 150 in FIG. 4B includes two 8-phase balanced mixers 152, 154. Each of the 8-phase mixers includes four two-phase mixers, one with mixers 156, 158, 160, 162 and one with mixers 164, 166, 168, 170, each combining a pair of phases that are 5 (mod 8) phase steps away from each other. The first 8-phase mixer (left side) 152 combines phases (0,5), (2,7), (4,1), (6,3). The second 8-phase mixer (right side) 154 combines phases (1,6), (3,0), (5,2), (7,4).

The timing diagram in FIG. 3 shows the overlapping times for each of these phase combinations. With eight phase combinations, there are eight unique overlapping times, the 8-phase mixer in FIG. 4 thus operating at a frequency that is four times the frequency of the 2-phase mixer.

Figure 2:
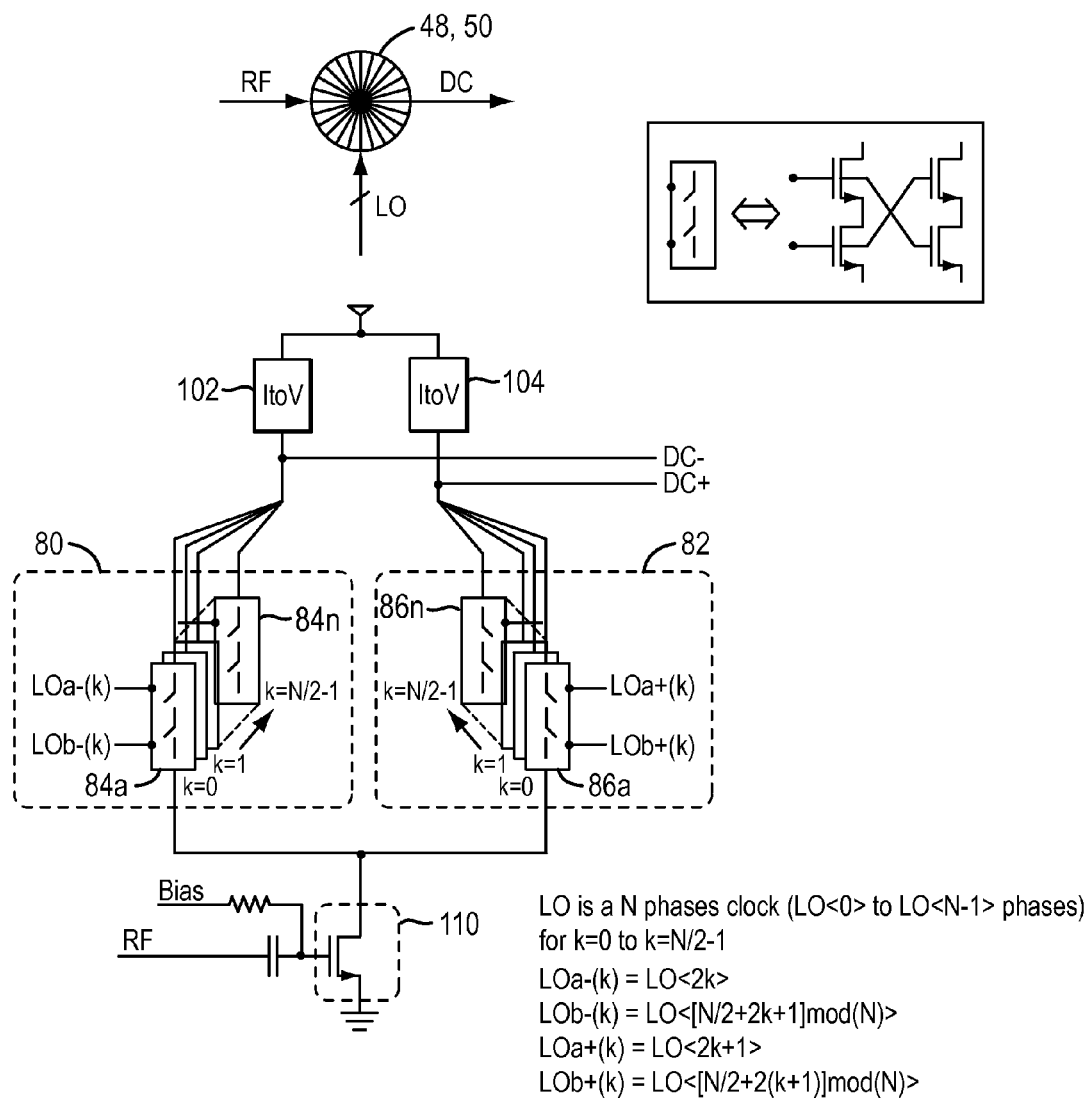
FIG. 2 shows an implementation of a N multi-phase mixer.

FIG. 2 shows an implementation of a N multi-phase mixer 48, 50. The extension from an 8-phase mixer to an N-phase mixer is clear. Similar to the 8-phase mixer, the N-phase mixer includes I-to-V converters 102 and 104 and two N-phase mixers 80 and 82. Each mixer includes N/2 two-phase mixers, one with mixers 84a, 84b-m, 84n and the other with 86a, 86b-m, 86n. Each of the mixers combines a pair of phases that are N/2+1 phase steps away from each other. Mixer 84a combines phases 0 and N/2+1 mod N and mixer 84n combines phases 2k (where k=(0 ... N/2−1)) and [N/2+2k+1] mod N, to maintain the phase separation to be the minimum phase overlap available. Similarly, mixer 86a combines phase 2k+1 with [N/2+2(k+1)] mod N and mixer 86n combines phase 1 with phase [N/2+2]. Essentially, for mixer 80 the even phases [0 ... (N−2)] are combined with the odd phases [1 ... N−1] where the latter set is rotated to create the minimum phase overlap in each mixer. For mixer 82, the odd phases [(N−1) ... 1] are combined with the even phases [(N−2) ... 0] where the latter set is rotated to create the minimum phase overlap in each mixer.

Although the present invention has been described in considerable detail with reference to certain preferred versions thereof, other versions are possible. Therefore, the spirit and scope of the appended claims should not be limited to the description of the preferred versions contained herein.

What is claimed is:

1. A multiphase mixer comprising:
 a rotary traveling wave oscillator configured to generate a rotary traveling wave oscillator signal having a plurality of N number of phases, each phase oscillating at a frequency that is less than a frequency of an incoming radio signal by a factor of N/2, said plurality of phases including a first plurality of phases and a second plurality of phases, said first plurality of phases being sine phases and said second plurality of phases being cosine phases, wherein the rotary travelling wave oscillator comprises:
 a differential transmission line in a closed loop, the differential transmission line including an odd number of one or more cross-overs configured to reverse the polarity of a wave propagating through the differential transmission line; and
 a plurality of regenerative devices electrically connected along a path of the differential transmission line;
 a first mixer circuit having an input configured to receive the incoming radio frequency signal and being coupled to receive the first plurality of phases from the rotary traveling wave oscillator, said first mixer circuit having an output that generates a first down converted signal; and
 a second mixer circuit having an input configured to receive the incoming radio frequency signal and being coupled to receive the second plurality of phases from the rotary traveling wave oscillator, said second mixer circuit having an output that generates a second down converted signal,
 wherein the first mixer circuit comprises a first plurality of phase-pair combining circuits, wherein the first plurality of phase-pair combining circuits combines pairs of phases in said plurality of phases with the incoming radio frequency signal to generate a first mixed output, wherein a first phase and a second phase of each pair of phases differ by N/2+1 phase steps.

2. The multiphase mixer as recited in claim 1, wherein the down converted signals are baseband signals.

3. The multiphase mixer as recited in claim 1,
 wherein each of the first and second mixer circuits includes N/2 phase-pair combining circuits,
 wherein each phase-pair combining circuit has a first pair of transistors in a CMOS configuration and a second pair of transistors in a CMOS configuration, each transistor having a source, a drain, a gate, and a channel being defined between the source and drain, wherein said first pair of transistors and said second pair of transistors are each configured with their channels in series between a first voltage source and a second voltage source, said first and second gates of the first pair of transistors connected to a first phase and a second phase, respectively, of the rotary traveling wave oscillator, and said first and second gates of the second pair of transistors connected to said second phase and said first phase, respectively, of the rotary traveling wave oscillator, said second phase being displaced (N/2+1) phase steps from the first phase, and wherein the differential output of each mixer circuit is present between the drains of each pair of transistors.

4. The multiphase mixer recited in claim 1, wherein each of the first and second mixer circuits includes N/2 phase-pair combining circuits, said phase-pair combining circuit being divided into two sections, each having N/2 phase-pair combining circuits, a first section of the two sections being coupled to N/2 phase signals from the rotary traveling wave oscillator, said N/2 phase signals being combined to obtain a first set of N/2 equally spaced phases, a second section of the two sections being coupled to N/2 phase signals from the rotary traveling wave oscillator, said N/2 phase signals being combined to obtain a second set of N/2 equally spaced phases, each phase in the second set being shifted by a phase step of 1/N from the first set.

5. The multiphase mixer recited in claim 1, wherein each of the first and second mixer circuits includes N/2 phase-pair combining circuits, said N/2 phase-pair combining circuits being divided into two sections, each having N/2 phase-pair combining circuits, a first section of the two sections being coupled to N/2 phase pair signals from the rotary traveling wave oscillator, each phase pair having phases 2k, (2k+N/2+1) mod N, respectively, where k is an positive integer with a range from 0 to N/2−1, a second section of the two sections being coupled to N/2 phase signals from the rotary traveling wave oscillator, each phase pair having phases 2k+1, (2k+1)+(N/2+1) mod N, respectively, where k is a positive integer with a range from 0 to N/2−1.

6. The multiphase mixer recited in claim 1,
wherein each of the first and second mixer circuits includes N/2 phase-pair combining circuits,
wherein each of the first and second mixer circuits includes a current source connected between the N/2 phase-pair combining circuits and a reference voltage, and
wherein the current source receives the incoming radio frequency signal.

7. The multiphase mixer as recited in claim 1, wherein the first mixed output is based on an overlap of the first phase and the second phase of each pair of phases.

8. The multiphase mixer as recited in claim 1, wherein N is equal to 8, wherein the plurality of phases comprises a first phase (CLK0), a second phase (CLK1), a third phase (CLK2), a fourth phase (CLK3), a fifth phase (CLK4), a sixth phase (CLK5), a seventh phase (CLK6), and an eighth phase (CLK7), wherein the first plurality of phase-pair combining circuits comprises:
a first phase-pair combining circuit configured to combine the first phase (CLK0) and the sixth phase (CLK5);
a second phase-pair combining circuit configured to combine the third phase (CLK2) and the eighth phase (CLK7);
a third phase-pair combining circuit configured to combine the fifth phase (CLK4) and the second phase (CLK1); and
a fourth phase-pair combining circuit configured to combine the seventh phase (CLK6) and the fourth phase (CLK3).

9. The multiphase mixer as recited in claim 1, wherein each of the first plurality of phase-pair combining circuits comprises a first metal oxide semiconductor (MOS) transistor and a second MOS transistor electrically connected in series, wherein a gate of the first MOS transistor receives the first phase, and wherein a gate of the second MOS transistor receives the second phase.

10. The multiphase mixer as recited in claim 1, wherein the second mixer circuit comprises a second plurality of phase-pair combining circuits, wherein the second plurality of phase-pair combining circuits combines pairs of phases in said plurality of phases with the incoming radio frequency signal to form a second mixed output, wherein a first phase and a second phase of each pair of phases differ by N/2+1 phase steps.

11. The multiphase mixer as recited in claim 10, wherein the second mixed output is based on an overlap of the first phase and the second phase of each pair of phases.

12. The multiphase mixer as recited in claim 10, wherein the second plurality of phase-pair combining circuits comprises:
a fifth phase-pair combining circuit configured to combine the eighth phase (CLK7) and the fifth phase (CLK4);
a sixth phase-pair combining circuit configured to combine the sixth phase (CLK5) and the third phase (CLK2);
a seventh phase-pair combining circuit configured to combine the fourth phase (CLK3) and the first phase (CLK0); and
an eighth phase-pair combining circuit configured to combine the second phase (CLK1) and the seventh phase (CLK6).

13. The multiphase mixer as recited in claim 10, further comprising:
a first low pass filter configured to receive the first down converted signal and to generate an in-phase (I) signal; and
a second low pass filter configured to receive the second down converted signal and to generate a quadrature-phase (Q) signal.

14. A multiphase mixer comprising:
a rotary traveling wave oscillator configured to generate a rotary traveling wave oscillator signal having a plurality of N number of phases, each phase oscillating at a frequency that is less than a frequency of an incoming radio signal by a factor of N/2, said plurality of phases including a first plurality of phases and a second plurality of phases, said first plurality of phases being sine phases and said second plurality of phases being cosine phases;
a first mixer circuit having an input configured to receive the incoming radio frequency signal and being coupled to receive the first plurality of phases from the rotary traveling wave oscillator, said first mixer circuit having an output that generates a first down converted signal; and
a second mixer circuit having an input configured to receive the incoming radio frequency signal and being coupled to receive the second plurality of phases from the rotary traveling wave oscillator, said second mixer circuit having an output that generates a second down converted signal,
wherein each of the first and second mixer circuits includes eight phase-pair combining circuits, said eight phase-pair combining circuits being divided into two sections, each having four phase-pair combining circuits, a first section of the two sections being coupled to eight phase pair signals from the rotary traveling wave oscillator, each phase pair having phases 2k, (2k+5) mod 8, respectively, where k is an positive integer with a range from 0 to 3, a second section of the two sections being coupled to eight phase signals from the rotary traveling wave oscillator, each phase pair having phases 2+1, (2k+1+5) mod 8, respectively, where k is a positive integer with a range from 0 to 3.

15. A method of mixing a signal, said method comprising:

providing a rotary traveling wave oscillator signal having a plurality N phases from a rotary traveling wave oscillator, each oscillating at a frequency that is less than a frequency of an incoming radio signal by a factor of N/2, said plurality of phases including a first plurality of phases and a second plurality of phases, wherein the rotary travelling wave oscillator comprises:

a differential transmission line in a closed loop, the differential transmission line including an odd number of one or more cross-overs configured to reverse the polarity of a wave propagating through the differential transmission line; and a plurality of regenerative devices electrically connected along a path of the differential transmission line;

combining pairs of phases in the first plurality of phases with the incoming radio frequency signal to form a first mixed output, wherein the phases in each pair differ by N/2+1 phase steps; and combining pairs of phases in the second plurality of phases with the incoming radio frequency signal to form a second mixed output, wherein the phases in each pair differ by N/2+1 phase steps, and wherein the first mixed output is orthogonal to the second mixed output.

16. The method of mixing a signal recited in claim 15, wherein each of the phases of the second plurality of phases differs respectively from each of the phases of the first plurality of phases by one phase step.

17. The method of mixing a signal recited in claim 15, wherein there are N/2 phases in the first plurality of phases and N/2 phases in the second plurality of phases.

18. The method of mixing a signal recited in claim 15, wherein the step of combining pairs of phases in the first plurality of phases with the incoming radio frequency signal to form a first mixed output includes combining each of N/2 pairs of phases with the incoming radio frequency signal.

19. The method of mixing a signal recited in claim 15, wherein the step of combining pairs of phases in the second plurality of phases with the incoming radio frequency signal to form a second mixed output includes combining each of N/2 pairs of phases with the incoming radio frequency signal.

* * * * *

UNITED STATES PATENT AND TRADEMARK OFFICE
CERTIFICATE OF CORRECTION

| | | |
|---|---|---|
| PATENT NO. | : 8,913,978 B2 | Page 1 of 1 |
| APPLICATION NO. | : 12/100391 | |
| DATED | : December 16, 2014 | |
| INVENTOR(S) | : Gregoire Le Grand De Mercey | |

It is certified that error appears in the above-identified patent and that said Letters Patent is hereby corrected as shown below:

In the claims

In column 7 at line 7, in Claim 14, change "2+1," to --2k+1,--

Signed and Sealed this
First Day of March, 2016

Michelle K. Lee
*Director of the United States Patent and Trademark Office*